US012188125B2

(12) United States Patent
Hotta et al.

(10) Patent No.: US 12,188,125 B2
(45) Date of Patent: Jan. 7, 2025

(54) SHOWERHEAD AND SUBSTRATE PROCESSING APPARATUS

(71) Applicant: Tokyo Electron Limited, Tokyo (JP)

(72) Inventors: Takanobu Hotta, Yamanashi (JP);
Takuya Kawaguchi, Yamanashi (JP);
Hideaki Yamasaki, Yamanashi (JP);
Toshio Takagi, Yamanashi (JP);
Takashi Kakegawa, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 333 days.

(21) Appl. No.: 17/805,062

(22) Filed: Jun. 2, 2022

(65) Prior Publication Data
US 2022/0396875 A1 Dec. 15, 2022

(30) Foreign Application Priority Data
Jun. 10, 2021 (JP) .................. 2021-097605

(51) Int. Cl.
*C23C 16/455* (2006.01)
*C23C 16/44* (2006.01)

(52) U.S. Cl.
CPC .... *C23C 16/45565* (2013.01); *C23C 16/4412* (2013.01)

(58) Field of Classification Search
CPC .............................................. C23C 16/45565
See application file for complete search history.

(56) References Cited

U.S. PATENT DOCUMENTS

| | | | | |
|---|---|---|---|---|
| 5,950,925 A | * | 9/1999 | Fukunaga | C23C 16/45574 239/428 |
| 6,302,964 B1 | * | 10/2001 | Umotoy | C23C 16/45574 118/715 |
| 2006/0174827 A1 | | 8/2006 | Bae et al. | |
| 2011/0048325 A1 | * | 3/2011 | Choi | C23C 16/45574 118/712 |
| 2014/0061324 A1 | * | 3/2014 | Mohn | H01J 37/3244 239/590 |
| 2014/0090599 A1 | * | 4/2014 | Saitou | B05B 1/005 118/728 |
| 2015/0267298 A1 | * | 9/2015 | Saitou | C23C 16/45544 118/725 |
| 2016/0068952 A1 | * | 3/2016 | Sasaki | C23C 16/4412 118/728 |
| 2016/0177445 A1 | * | 6/2016 | Takahashi | C23C 16/45591 118/728 |
| 2018/0308709 A1 | * | 10/2018 | Yamasaki | H01L 21/28556 |

FOREIGN PATENT DOCUMENTS

| | | |
|---|---|---|
| JP | 2014-070249 | 4/2014 |
| KR | 10-0562994 | 3/2006 |
| KR | 10-2009-0051469 | 5/2009 |

* cited by examiner

*Primary Examiner* — Keath T Chen
(74) *Attorney, Agent, or Firm* — IPUSA, PLLC

(57) ABSTRACT

A showerhead includes a shower plate, a base member in which a gas flow passage is provided, the base member fixing the shower plate, a plurality of gas supply members disposed in a gas diffusion space and connected to the gas flow passage, the gas diffusion space being formed between the shower plate and the base member, and a flow adjusting plate disposed in the gas diffusion space, the flow adjusting plate being disposed on an outer periphery on an outer side from the plurality of gas supply members.

8 Claims, 10 Drawing Sheets

FIG.5

| | REFERENCE EXAMPLE | FIRST EMBODIMENT |
|---|---|---|
| | (contour plot with labels 401, 402) | (contour plot) |
| Ave. [A] | 32.9 | 31.8 |
| 1σ | 3.4 | 2.8 |

| | REFERENCE EXAMPLE | SECOND EMBODIMENT |
|---|---|---|
| |  |  |
| Ave. [A] | 33.6 | 32.0 |
| 1σ | 3.3 | 2.9 |

# SHOWERHEAD AND SUBSTRATE PROCESSING APPARATUS

CROSS-REFERENCE TO RELATED APPLICATIONS

This patent application is based on and claims priority to Japanese Patent Application No. 2021-097605 filed on Jun. 10, 2021, the entire contents of which are incorporated herein by reference.

TECHNICAL FIELD

The present disclosure relates to a showerhead and a substrate processing apparatus.

BACKGROUND

Patent Document 1 describes a deposition apparatus including: a stage, provided in a processing chamber, on which a substrate is mounted; a ceiling provided opposite to the stage and having a sloped surface structure formed in a shape that expands from a center to an outer circumference; multiple gas supplies, provided in a central region of the ceiling, in which gas outlets are formed along a circumferential direction of the ceiling; a showerhead, provided to cover the multiple gas supplies from a lower side, in which multiple gas inlets are formed on a surface opposing to the stage; and an exhaust configured to exhaust the inside of the processing chamber by vacuuming, wherein an outer edge of the showerhead is positioned inside an outer edge of the substrate mounted on the stage.

In a substrate processing apparatus that performs a process, such as film deposition, on a substrate, it is desired to improve the in-plane distribution of the film thickness.

One aspect of the present disclosure is directed to providing a showerhead and a substrate processing apparatus that improve the in-plane distribution of the film thickness.

RELATED ART DOCUMENT

Patent Document

[Patent Document 1] Japanese Laid-open Patent Application Publication No. 2014-70249

SUMMARY

A showerhead includes a shower plate, a base member in which a gas flow passage is provided, the base member fixing the shower plate, a plurality of gas supply members disposed in a gas diffusion space and connected to the gas flow passage, the gas diffusion space being formed between the shower plate and the base member, and a flow adjusting plate disposed in the gas diffusion space, the flow adjusting plate being disposed on an outer periphery on an outer side from the plurality of gas supply members.

BRIEF DESCRIPTION OF THE DRAWINGS

FIG. 5 is a drawing illustrating an example of the in-plane distribution;

DETAILED DESCRIPTION OF EMBODIMENTS

In the following, embodiments of the present disclosure will be described with reference to the drawings. In each drawing, the same components are referenced by the same reference signs and overlapping description may be omitted.

<Substrate Processing Apparatus>

Figure 1:
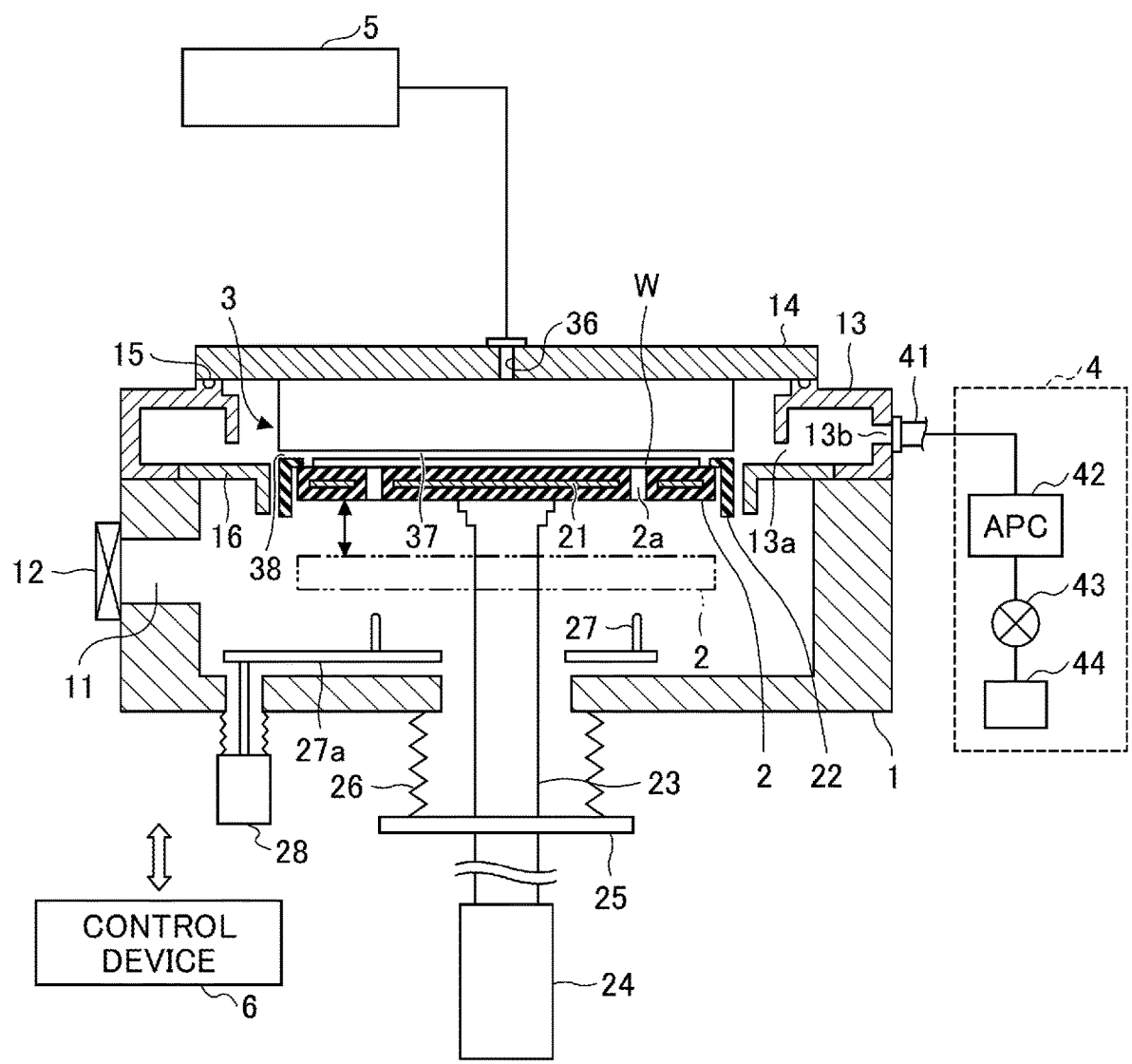
FIG. 1 illustrates an example of a cross-sectional view of a substrate processing apparatus according to the present embodiment.
Figure 2:
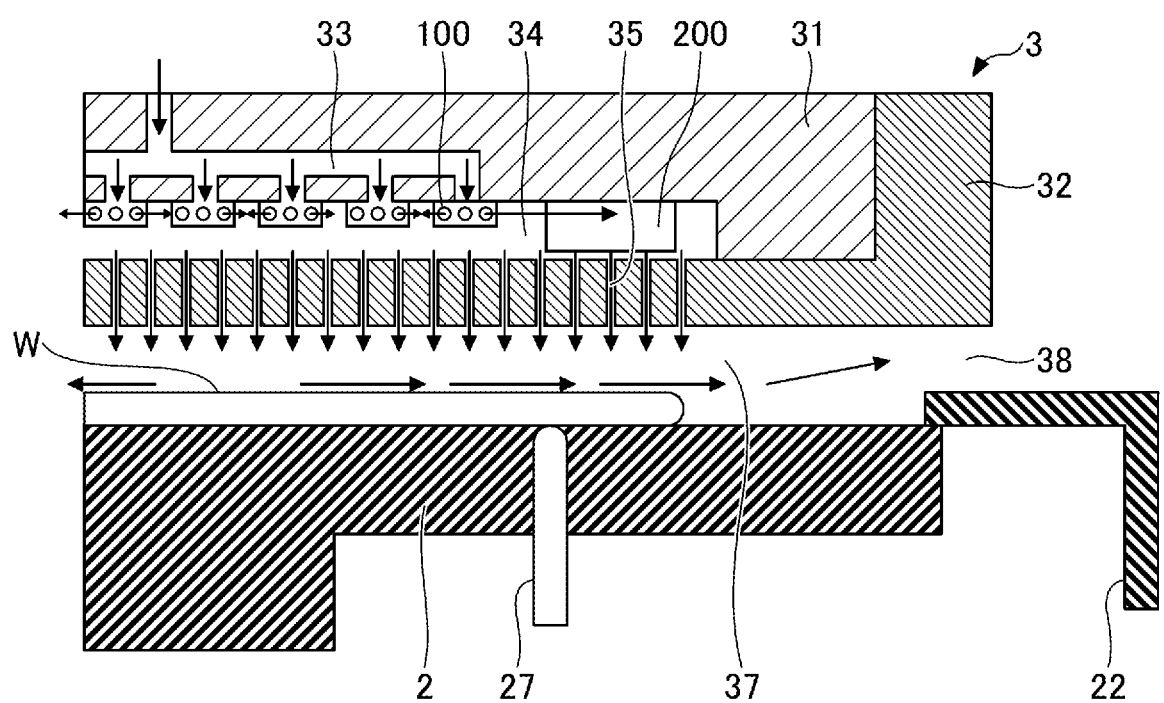
FIG. 2 illustrates an example of a cross-sectional view depicting a structure of a showerhead of the substrate processing apparatus according to the present embodiment.

A substrate processing apparatus according to the present embodiment will be described with reference to FIG. 1 and FIG. 2. FIG. 1 is an example of a cross-sectional view of the substrate processing apparatus according to the present embodiment. FIG. 2 is an example of a cross-sectional view depicting a structure of a showerhead 3 of the substrate processing apparatus according to the present embodiment.

The substrate processing apparatus is an apparatus that deposits a tungsten film, which is a metal film, onto a surface of a substrate W by supplying a $WCl_5$ gas as a raw gas and an $H_2$ gas as a reaction gas to the substrate W, such as a wafer. The substrate processing apparatus may, for example, be an atomic layer deposition (ALD) apparatus or the like.

As illustrated in FIG. 1 and FIG. 2, the substrate processing apparatus includes a processing chamber 1, a substrate stage 2, a showerhead 3, an exhaust part 4, a gas supply mechanism 5, and a control device 6.

The processing chamber 1 is made of metal such as aluminum, and has a substantially cylindrical shape. A transfer inlet/outlet 11 for transferring the substrate W in the processing chamber 1 and outside of the processing chamber 1 is formed at the side wall of the processing chamber 1, and the transfer inlet/outlet 11 can be opened and closed by a gate valve 12. An annular exhaust duct 13 having a rectangular shape in the cross-section is provided on a body of the processing chamber 1. A slit 13a is formed in the exhaust duct 13 along an inner circumferential surface. Additionally, an exhaust outlet 13b is formed in an outer wall of the exhaust duct 13. A top wall 14 is provided on an upper surface of the exhaust duct 13 to cover an upper opening of the processing chamber 1. The top wall 14 and the exhaust duct 13 are hermetically sealed by a seal ring 15. When the substrate stage 2 (and a cover member 22) is raised to a processing position (a first processing position and a second processing position) described later, a partition member 16 vertically partitions the inside of the processing chamber 1.

The substrate stage 2 horizontally supports the substrate W in the processing chamber 1. The substrate stage 2 has a disk shape of a size corresponding to the substrate W and is supported by a support member 23. The substrate stage 2 is made of a ceramic material such as aluminum nitride (AlN) or a metal material such as aluminum or a nickel-based alloy, and a heater 21 that heats the substrate W is embedded inside. The heater 21 is powered from a heater power supply (not shown) and generates heat. The output of the heater 21 is controlled by a temperature signal of a thermocouple (not shown) provided near a surface of the upper surface of the substrate stage 2 on which the substrate is mounted, so that the temperature of the substrate W is controlled to a predetermined temperature.

The substrate stage 2 is provided with a cover member 22, formed of ceramic, such as alumina, to cover an outer circumferential area of the surface on which the substrate is mounted and a side surface of the substrate stage 2.

The support member 23 passes through a hole formed in the bottom wall of the processing chamber 1 from the center of the bottom surface of the substrate stage 2 and extends to under the processing chamber 1, and a lower end thereof is connected to a lifting mechanism 24. The substrate stage 2 can be raised and lowered via the support member 23 by the lifting mechanism 24 between the first processing position illustrated by the solid line in FIG. 1, the second processing position illustrated by the solid line in FIG. 2, and a transfer position, illustrated by a double-dotted line in FIG. 1, at which the substrate W can be transferred under the first and second processing positions. Additionally, a flange 25 is attached to the support member 23 at a lower side from the processing chamber 1 and a bellows 26 that partitions the atmosphere in the processing chamber 1 from the outside air and that expands and contracts in accordance with the raising and lowering operation of the substrate stage 2 is provided between the bottom surface of the processing chamber 1 and the flange 25.

Near the bottom surface of the processing chamber 1, three substrate support pins 27 (only two are illustrated) are provided to protrude upward from a lift plate 27a. The substrate support pin 27 is configured to be raised and lowered via the lift plate 27a by a lifting mechanism 28 provided under the processing chamber 1 and is configured to pass through through-holes 2a provided in the substrate stage 2, which is at the transfer position, so that the substrate support pin 27 can protrude and retract with respect to the upper surface of the substrate stage 2. As described above, the substrate support pin 27 is raised and lowered, so that the substrate W is transferred between a substrate transfer mechanism (which is not illustrated) and the substrate stage 2.

The showerhead 3 supplies a process gas into the processing chamber 1 in a shower form. The showerhead 3 is made of metal and is provided opposite to the substrate stage 2. The top wall 14 is provided with a gas supply passage 36 that connects to the showerhead 3 (a gas supply passage 33 described later).

In a state in which the substrate stage 2 is at the processing position, a processing space 37 is formed between the showerhead 3 (a shower plate 32 described later) and the substrate stage 2, and the showerhead 3 (the shower plate 32 described later) and the upper surface of the cover member 22 of the substrate stage 2 are close to each other and an annular gap 38 is formed.

The exhaust part 4 exhausts the inside of the processing chamber 1. The exhaust part 4 includes an exhaust pipe 41 connected to the exhaust outlet 13b of the exhaust duct 13, an auto pressure controller (APC) valve 42, an open/close valve 43, and a vacuum pump 44. One end of the exhaust pipe 41 is connected to the exhaust outlet 13b of the exhaust duct 13 and the other end is connected to an inlet of the vacuum pump 44. The APC valve 42 and the open/close valve 43 are provided between the exhaust duct 13 and the vacuum pump 44 in this order from the upstream side. The APC valve 42 regulates the conductance of the exhaust passage to adjust the pressure of the processing space 37. The open/close valve 43 switches the opening and closing of the exhaust pipe 41. During the processing, the partition member 16 and the substrate stage 2 (the cover member 22) partition the inside of the processing chamber 1 into an upper space including the processing space 37 and a lower space on the back side of the substrate stage 2. This causes the gas in the processing space 37 to reach an annular space inside the exhaust duct 13 through the annular gap 38 and the slit 13a, and is exhausted from the exhaust outlet 13b of the exhaust duct 13 through the exhaust pipe 41 by the vacuum pump 44 in the exhaust part 4. Here, the lower space is controlled to be the purge atmosphere by a purge gas supply mechanism (not illustrated). Therefore, the gas in the processing space 37 does not flow into the lower space.

The gas supply mechanism 5 supplies the raw gas, the reaction gas, and the purge gas to the gas supply passage 36. In the following description, the raw gas is $WCl_5$, the reaction gas is $H_2$, and the purge gas is $N_2$. The gas supplied to the gas supply passage 36 is supplied from the showerhead 3 to the processing space 37.

The control device 6 controls the operation of each part of the substrate processing apparatus. The control device 6 includes a central processing unit (CPU), a read only memory (ROM), and a random access memory (RAM). The CPU performs a desired process according to a recipe stored in a storage area such as the RAM. In the recipe, apparatus control information for process conditions is set. The control information may be, for example, the gas flow rate, the pressure, the temperature, and the process time. Here, the recipe and a program used by the control device 6 may be stored in, for example, a hard disk drive or a semiconductor memory. Additionally, the recipe or the like may be stored in a portable computer-readable storage medium such as a CD-ROM, a DVD, or the like, the portable computer-readable storage medium may be set at a predetermined position, and the recipe may be read out.

The control device 6 repeats a raw gas supply step, a first purge gas supply step, a reaction gas supply step, and a second purge gas supply step to form a tungsten film on the substrate W.

In the raw gas supply step, the control device 6 controls the gas supply mechanism 5 to supply the raw gas ($WCl_5$) to the processing space 37. This causes the raw gas to be adsorbed on the surface of the substrate W.

In the first purge gas supply step, the control device 6 controls the gas supply mechanism 5 to supply the purge gas ($N_2$) to the processing space 37. This purges the excessive raw gas and the like in the processing space 37.

In the reaction gas supply step, the control device 6 controls the gas supply mechanism 5 to supply the reaction gas ($H_2$) to the processing space 37. This causes the reaction gas to react with the raw gas adsorbed on the surface of the substrate W, and a tungsten film to be formed on the surface of the substrate W.

In the second purge gas supply step, the control device 6 controls the gas supply mechanism 5 to supply the purge gas ($N_2$) to the processing space 37. This purges the excessive reaction gas or the like in the processing space 37.

As described above, by repeating the raw gas supply step, the first purge gas supply step, the reaction gas supply step, and the second purge gas supply step by a predetermined number of times, the tungsten film is formed on the substrate W.

<Structure of the Showerhead>

Figure 3:
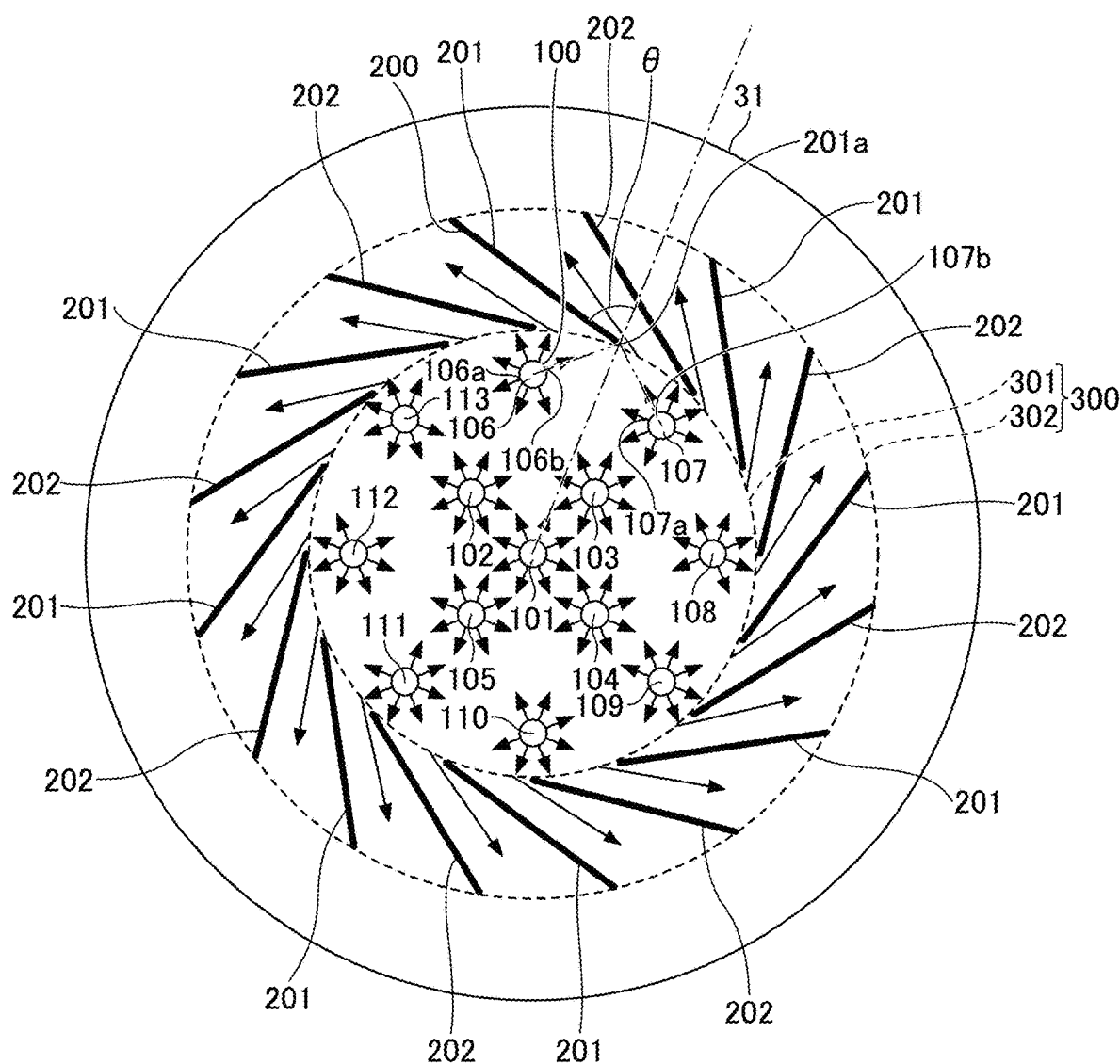
FIG. 3 illustrates an example of a plan view depicting a structure of a showerhead of a substrate processing apparatus according to a first embodiment.

Next, a structure of the showerhead 3 will be further described with reference to FIG. 2. FIG. 2 is an example of a cross-sectional view depicting the structure of the showerhead 3 of the substrate processing apparatus according to the present embodiment. FIG. 3 is an example of a plan view depicting a structure of a showerhead 3 of a substrate processing apparatus according to a first embodiment. In FIG. 2 and FIG. 3, the gas flow is indicated by arrows.

The showerhead 3 includes a base member 31 fixed to the top wall 14 of the processing chamber 1 and a shower plate 32 connected under the base member 31. In the base member 31, a gas supply passage 33 (a gas flow passage) that is connected to the gas supply passage 36 (see FIG. 1) on the upstream side and that has multiple branches on the downstream side is formed. A gas diffusion space 34 is formed between the base member 31 and the shower plate 32. Multiple gas discharge holes 35 are formed on the flat surface of the shower plate 32. The gas supplied from the gas supply passage 36 (see FIG. 1) flows through the gas supply passage 33, the gas diffusion space 34, and the gas discharge holes 35, and is supplied to the processing space 37. The gas in the processing space 37 is then exhausted from the annular gap 38 to the exhaust duct 13 (see FIG. 1).

Additionally, a gas supply part (a gas supply member) 100 and a flow adjusting plate 200 are provided in the gas diffusion space 34.

The gas supply part 100 is connected to each of the lower ends of the gas supply passage 33. The gas supply part 100 has a hollow cylindrical shape. The upper surface of the gas supply part 100 has an opening (not illustrated) to communicate the hollow space of the gas supply part 100 to the gas supply passage 33. The bottom surface of the gas supply part 100 is closed. The side surface (a circumferential surface) of the gas supply part 100 includes multiple discharge outlets for discharging gas in the horizontal direction. This allows the gas supplied from the gas supply passage 36 (see FIG. 1) to be supplied from the gas supply passage 33 to the gas supply part 100, and supplied into the gas diffusion space 34 in the horizontal direction from the discharge outlets of the gas supply part 100.

Here, as illustrated in FIG. 3, the gas supply part 100 includes a gas supply part 101, four gas supply parts 102 to 105 disposed at equal intervals on a circumference, and eight gas supply parts 106 to 113 disposed at equal intervals on a circumference. The gas supply part 101 is disposed at the center of the showerhead 3 (the center of the base member 31). The gas supply parts 102 to 105 are disposed at equal intervals on a circumference that is concentric with the showerhead 3. The gas supply parts 106 to 113 are disposed at equal intervals about a circumference that is concentric with the showerhead 3 outside the gas supply parts 102 to 105.

In FIG. 3, the gas discharge directions of the gas supply part 100 (101 to 113) are indicated by arrows.

Eight discharge outlets of each of the gas supply part 101 and the gas supply parts 102 to 105 are provided at equal intervals in the circumferential direction.

With respect to the above, the discharge outlets of each of the gas supply parts 106 to 113 are provided in seven directions among eight directions equally divided in the circumferential direction. Here, in each of the gas supply parts 106 to 113, which are arranged in an annular shape, a discharge outlet is provided in a direction toward the center of one adjacent gas supply part, and no discharge outlet is provided in a direction toward the center of the other adjacent gas supply part. Specifically, in the gas supply part 106, a discharge outlet 106a is provided in a direction from the center of the gas supply part 106 toward the center of one adjacent gas supply part, which is the gas supply part 113, and no discharge outlet is provided in a direction from the center of the gas supply part 106 toward the center of the other adjacent gas supply part, which is the gas supply part 107. Additionally, in the gas supply part 107, a discharge outlet 107a is provided in a direction from the center of the gas supply part 107 toward the center of one adjacent gas supply part, which is the gas supply part 106, and no discharge outlet is provided in a direction from the center of the gas supply part 107 to the center of the other adjacent gas supply part, which is the gas supply part 108. This prevents the gas from flowing in opposite directions on a line connecting the center of the gas supply part 106 to the center of the adjacent gas supply part 107 and suppresses generation of an area where the gas pressure is high.

Similarly, in the gas supply part 108, a discharge outlet is provided in a direction from the center of the gas supply part 108 toward the center of one adjacent gas supply part, which is the gas supply part 107, and no discharge outlet is provided in a direction from the center of the gas supply part 108 toward the center of the other adjacent gas supply part, which is the gas supply part 109. In the gas supply part 109, a discharge outlet is provided in a direction from the center of the gas supply part 109 to the center of one adjacent gas supply part, which is the gas supply part 108, and no outlet is provided in a direction from the center of the gas supply part 109 to the center of the other adjacent gas supply part, which is the gas supply part 110. In the gas supply part 110, a discharge outlet is provided in a direction from the center of the gas supply part 110 to the center of one adjacent gas supply part, which is the gas supply part 109, and no outlet is provided in a direction from the center of the gas supply part 110 to the center of the other adjacent gas supply part, which is the gas supply part 111. In the gas supply part 111, a discharge outlet is provided in a direction from the center of the gas supply part 111 to the center of one adjacent gas supply part, which is the gas supply part 110, and no discharge outlet is provided in a direction from the center of the gas supply part 111 to the center of the other adjacent gas supply part, which is the gas supply part 112. In the gas supply part 112, a discharge outlet is provided in a direction from the center of the gas supply part 112 to the center of one adjacent gas supply part, which is the gas supply part 111, and no discharge outlet is provided in a direction from the center of the gas supply part 112 to the center of the other adjacent gas supply part, which is the gas supply part 113. In the gas supply part 113, a discharge outlet is provided in a direction from the center of the gas supply part 113 to the center of one adjacent gas supply part, which is the gas supply part 112, and no discharge outlet is provided in a direction from the center of the gas supply part 113 to the center of the other adjacent gas supply part, which is the gas supply part 106. This prevents the gas from flowing in opposite directions on a line connecting the center of the gas supply part and the center of the adjacent gas supply part, and suppresses generation of an area where the gas pressure is high.

The flow adjusting plate 200 is disposed on the outer circumferential side from the gas supply parts 106 to 113, which are disposed on the outer circumference. The flow adjusting plate 200 includes a flow adjusting plate 201 and a flow adjusting plate 202.

The flow adjusting plate 200 is tilted at a predetermined angle θ with respect to a line radially extending from the center of the showerhead 3 (a line extending in a radial direction) (see a dash-dot-dash line). Additionally, the flow adjusting plate 200 is disposed in an annular region (an outer periphery) 300 between a first circle 301 (see a dashed line) and a second circle 302 (see a dashed line), which have the same center as the showerhead 3. Here, the second circle 302 indicates the position of the inner circumferential wall of the gas diffusion space 34.

Here, in the gas supply part 106, a discharge outlet 106*b* is defined as the first discharge outlet, among all the discharge outlets of the gas supply part 106, that is located in a direction of rotation from a centerline between the centers of the gas supply part 106 and the adjacent gas supply part 107 toward the outer circumferential side of the showerhead 3 (this direction is counter-clockwise in FIG. 3). In the gas supply part 107, a discharge outlet 107*b* is defined as the first discharge outlet, among all the discharge outlets of the gas supply part 107, that is located in a direction of rotation from a centerline between the centers of the gas supply part 107 and the adjacent gas supply part 106 toward the outer circumferential side. The flow adjusting plate 201 is provided to include a portion 201*a* where the discharge direction (see the dash-dot-dot-dash line) of the gas discharged from the discharge outlet 106*b* of the gas supply part 106 and the discharge direction (see the dash-dot-dot-dash line) of the gas discharged from the discharge outlet 107*b* of the gas supply part 107 intersect with each other. Additionally, the flow adjusting plate 201 is provided to start from the portion 201*a* where the discharge direction of the gas discharged from the discharge outlet 106*b* of the gas supply part 106 and the discharge direction of the gas discharged from the discharge outlet 107*b* of the gas supply part 107 intersect with each other. In other words, the first circle 301 is a circle passing through the portion 201*a* where the discharge direction (see the dash-dot-dot-dash line) of the gas discharged from the discharge outlet 106*b* of the gas supply part 106 and the discharge direction (see the dash-dot-dot-dash line) of the gas discharged from the discharge outlet 107*b* of the gas supply part 107 intersect with each other.

By providing the flow adjusting plate 201, the merge of the gas discharged from the discharge outlet 106*b* of the gas supply part 106 and the gas discharged from the discharge outlet 107*b* of the gas supply part 107 can be suppressed, thereby suppressing generation of an area where the gas pressure is high.

In other words, the flow adjusting plate 201 is disposed so that an end of the flow adjusting plate 201 on the first circle 301 side is between the gas supply part 106 and the gas supply part 107, which are arranged side by side, in the circumferential direction of the showerhead 3. Similarly, the flow adjusting plate 201 is disposed so that an end of the flow adjusting plate 201 on the first circle 301 side is between the gas supply part 107 and the gas supply part 108, which are arranged side by side. The flow adjusting plate 201 is disposed so that an end of the flow adjusting plate 201 on the first circle 301 side is between the gas supply part 108 and the gas supply part 109, which are arranged side by side. The flow adjusting plate 201 is disposed so that an end of the flow adjusting plate 201 on the first circle 301 side is between the gas supply part 109 and the gas supply part 110, which are arranged side by side. The flow adjusting plate 201 is disposed so that an end of the flow adjusting plate 201 on the first circle 301 side is between the gas supply part 110 and the gas supply part 111, which are arranged side by side. The flow adjusting plate 201 is disposed so that an end of the flow adjusting plate 201 on the first circle 301 side is between the gas supply part 111 and the gas supply part 112, which are arranged side by side. The flow adjusting plate 201 is disposed so that an end of the flow adjusting plate 201 on the first circle 301 side is between the gas supply part 112 and the gas supply part 113, which are arranged side by side. The flow adjusting plate 201 is disposed so that an end of the flow adjusting plate 201 on the first circle 301 side is between the gas supply part 113 and the gas supply part 106, which are arranged side by side.

Additionally, the flow adjusting plate 202 is provided between the flow adjusting plates 201 adjacent to each other (i.e., between two flow adjusting plates 201 neighboring in the circumferential direction). In the example illustrated in FIG. 3, one flow adjusting plate 202 is disposed between the flow adjusting plates 201. Here, multiple flow adjusting plates 202 may be disposed between the flow adjusting plates 201. By providing the flow adjusting plate 202, the annular region 300 is partitioned, thereby improving the uniformity of the gas flow.

Figure 4:
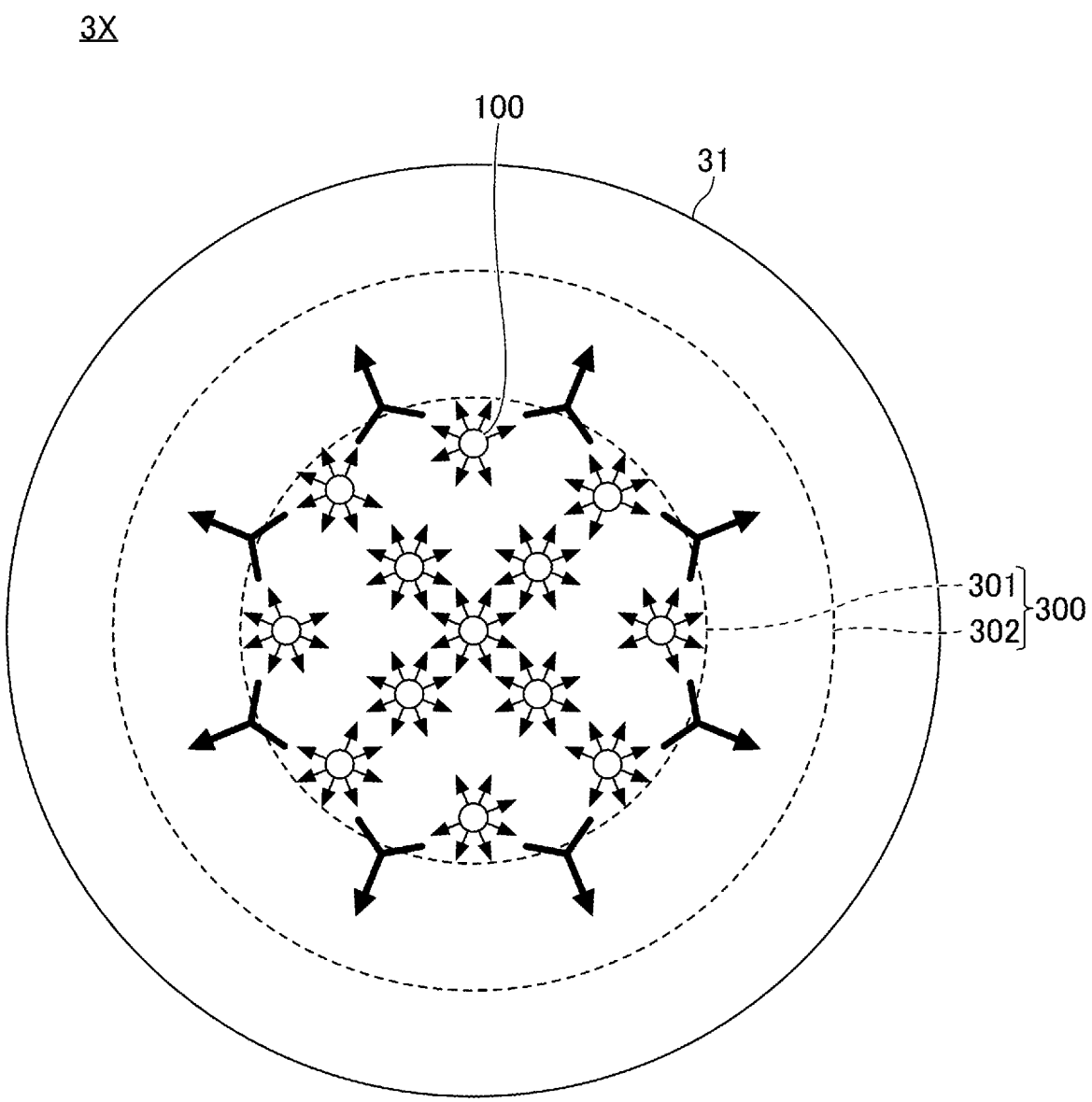
FIG. 4 illustrates an example of a plan view depicting a structure of a showerhead of a substrate processing apparatus according to a reference example.

Here, the structure of a showerhead 3X of a substrate processing apparatus according to a reference example will be described with reference to FIG. 4. FIG. 4 is an example of a plan view depicting the structure of the showerhead 3X of the substrate processing apparatus according to the reference example.

The structure of the showerhead 3X of the substrate processing apparatus according to the reference example (see FIG. 4) differs from the structure of the showerhead 3 of the substrate processing apparatus according to the first embodiment (see FIG. 3) in that the flow adjusting plate 200 is not provided. The other configurations are substantially the same, and overlapping description is omitted.

In the showerhead 3X, the gases supplied from the gas supply parts 100 adjacent to each other merge as indicated by the thick line arrow.

The effect of the showerhead 3 of the substrate processing apparatus according to the first embodiment will be described in comparison with the showerhead 3X of the substrate processing apparatus according to the reference example. FIG. 5 is a diagram illustrating an example of the in-plane distribution.

Here, the tungsten film is deposited on the substrate W using the substrate processing apparatus according to the first embodiment that includes the showerhead 3 (see FIG. 3) and the substrate processing apparatus according to the reference example that includes the showerhead X3 (see FIG. 4). The film thickness distribution is indicated by dot shading.

In the film thickness distribution of the reference example, regions where the film thickness is thick is generated at positions 401 and 402 where the gases discharged from the gas supply parts 100 merge. The mean film thickness (Ave.) and standard deviation (1σ) of the reference example are 32.9 Å and 3.4, respectively.

With respect to the above, in the film thickness distribution according to the first embodiment, by providing the flow adjusting plate 200 (201 and 202), the increase in the film thickness at the position where the gases discharged from the gas supply parts 100 merge is suppressed. The average film thickness (Ave.) and the standard deviation (1σ) according to the first embodiment are 31.8 Å and 2.8, respectively.

As described above, by providing the flow adjusting plate 200 in the gas diffusion space 34, the in-plane uniformity of the tungsten film deposited on the substrate W can be improved.

Here, the structure of the showerhead 3 of the substrate processing apparatus is not limited to the structure illustrated in FIG. 3.

Figure 6:
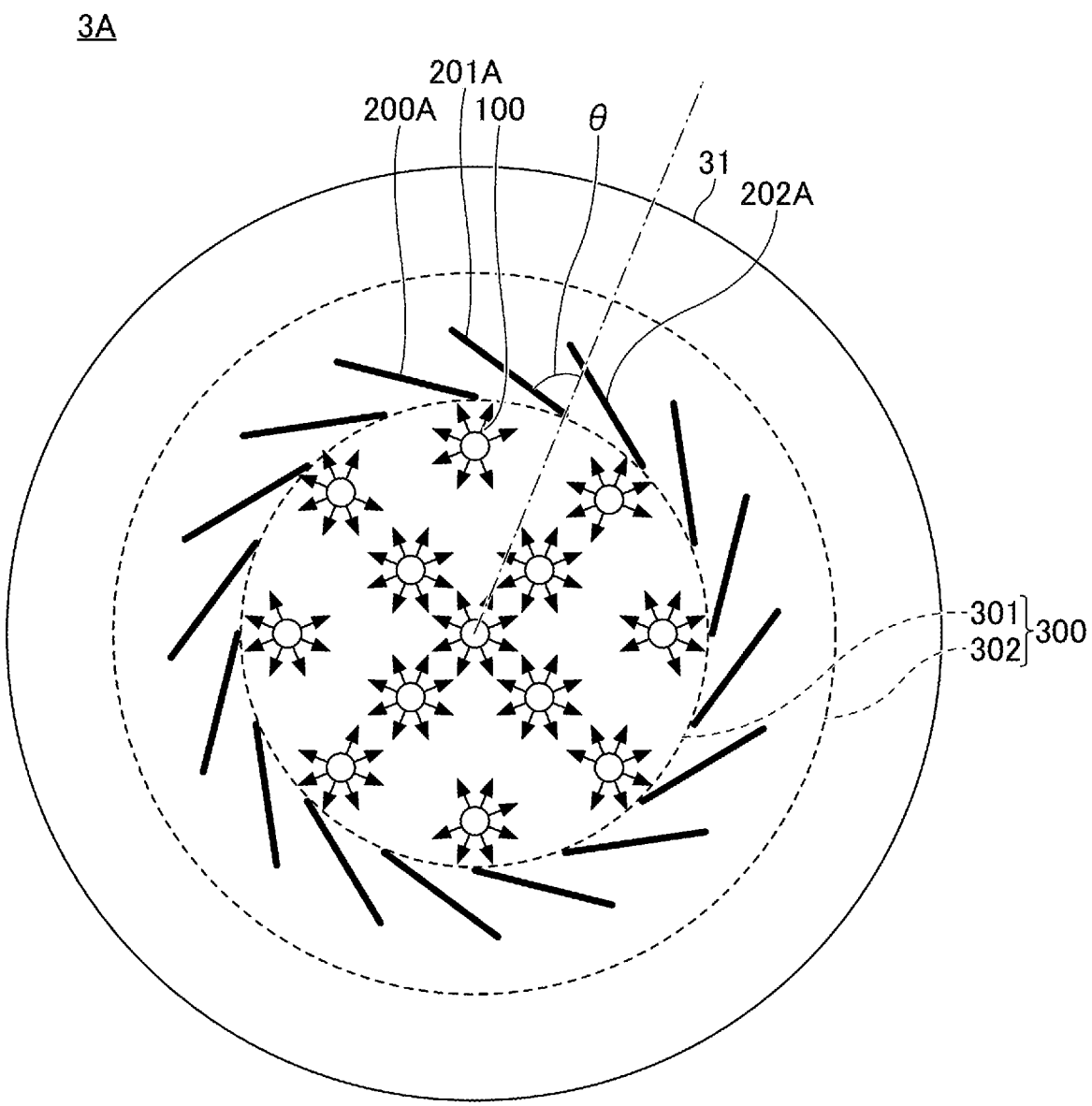
FIG. 6 illustrates an example of a plan view depicting a structure of a showerhead of a substrate processing apparatus according to a second embodiment.

FIG. 6 is an example of a plan view illustrating a structure of a showerhead 3A of a substrate processing apparatus according to a second embodiment. The structure of the showerhead 3A of the substrate processing apparatus according to the second embodiment (see FIG. 6) includes a flow adjusting plate 200A. The flow adjusting plate 200A includes a flow adjusting plate 201A and a flow adjusting plate 202A. The flow adjusting plate 201A is provided to pass through a portion where the discharge directions of the gas supply parts 100 arranged side by side intersect. The flow adjusting plate 202A is provided between the flow adjusting plates 201A adjacent to each other. The flow adjusting plate 200A (201A and 202A) is formed to be shorter on the outer circumferential side than the flow adjusting plate 200 (201 and 202). That is, the annular region 300 includes a region in which the flow adjusting plates 200A are disposed and an annular space region located on the outer circumferential side from the region in which the flow adjusting plates 200A are disposed. The other configurations are substantially the same, and overlapping description is omitted.

Figure 7:
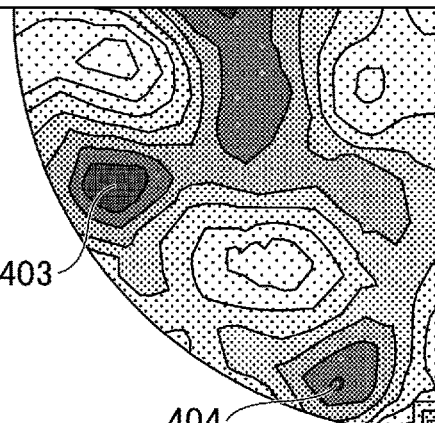
FIG. 7 is a drawing illustrating an example of the in-plane distribution.
Figure 7:
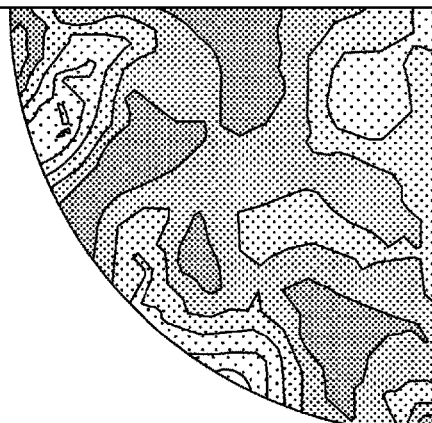

The effect of the showerhead 3A of the substrate processing apparatus according to the second embodiment will be described in comparison with the showerhead 3X of the substrate processing apparatus according to the reference example. FIG. 7 is a diagram illustrating an example of the in-plane distribution.

Here, the tungsten film is deposited on the substrate W using the substrate processing apparatus according to the second embodiment that includes the showerhead 3A (see FIG. 6) and the substrate processing apparatus according to the reference example that includes the showerhead X3 (see FIG. 4). The film thickness distribution is indicated by dot shading.

In the film thickness distribution of the reference example, regions where the film thickness is thick is generated at positions 403 and 404 where the gases discharged from the gas supply parts 100 merge. The mean film thickness (Ave.) and the standard deviation (1σ) according to the reference example are 33.6 Å and 3.3, respectively.

With respect to the above, in the film thickness distribution according to the second embodiment, by providing the flow adjusting plate 200A, the increase in the film thickness at the position where the gases discharged from the gas supply parts 100 merge is suppressed. The average film thickness (Ave.) and the standard deviation (1σ) according to the second embodiment are 32.0 Å and 2.9, respectively.

As described above, by providing the flow adjusting plate 200A in the gas diffusion space 34, the in-plane uniformity of the tungsten film deposited on the substrate W can be improved.

Figure 8:
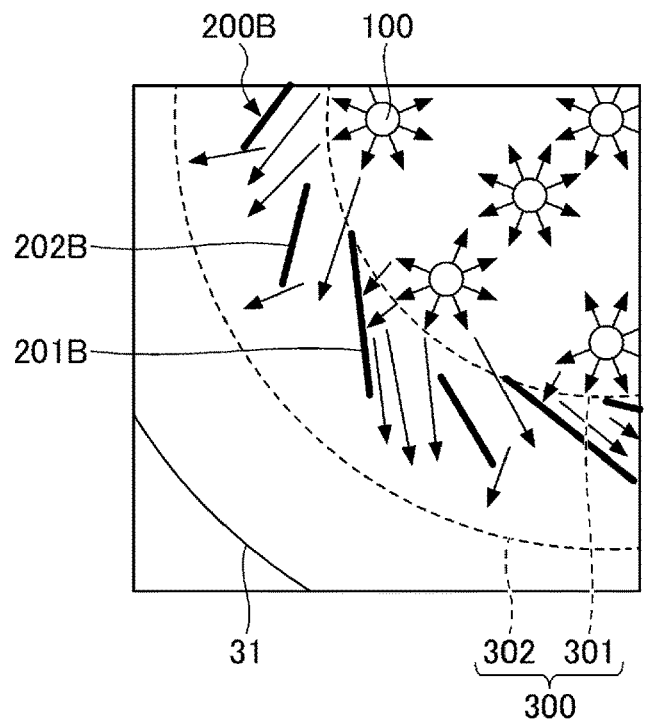
FIG. 8 illustrates an example of a plan view depicting a structure of a showerhead of a substrate processing apparatus according to a third embodiment.

FIG. 8 is an example of a plan view depicting a structure of a showerhead 3B of a substrate processing apparatus according to a third embodiment. The structure of the showerhead 3B of the substrate processing apparatus according to the third embodiment includes a flow adjusting plate 200B. The flow adjusting plate 200B includes a flow adjusting plate 201B and a flow adjusting plate 202B. The flow adjusting plate 201B is provided to pass through a portion where the discharge directions of the gas supply parts 100 arranged side by side intersect. The flow adjusting plate 202B is provided between the flow adjusting plates 201B adjacent to each other. Here, the flow adjusting plates 200B (201B and 202B) are alternately formed to be shorter on the inner circumferential side of the flow adjusting plates 200B than the flow adjusting plates 200A (201A and 202A) illustrated in FIG. 6. Specifically, the flow adjusting plate 202B is formed to be shorter on the inner circumferential side of the flow adjusting plate 202B than the flow adjusting plate 202A. Additionally, the flow adjusting plate 202B is formed to be shorter on the inner circumferential side of the flow adjusting plate 202B than the flow adjusting plate 201B. By forming the flow adjusting plate 202B to be short on the inner circumferential side, the gas flow can be adjusted, thereby improving the in-plane uniformity of the tungsten film deposited on the substrate W.

Figure 9:
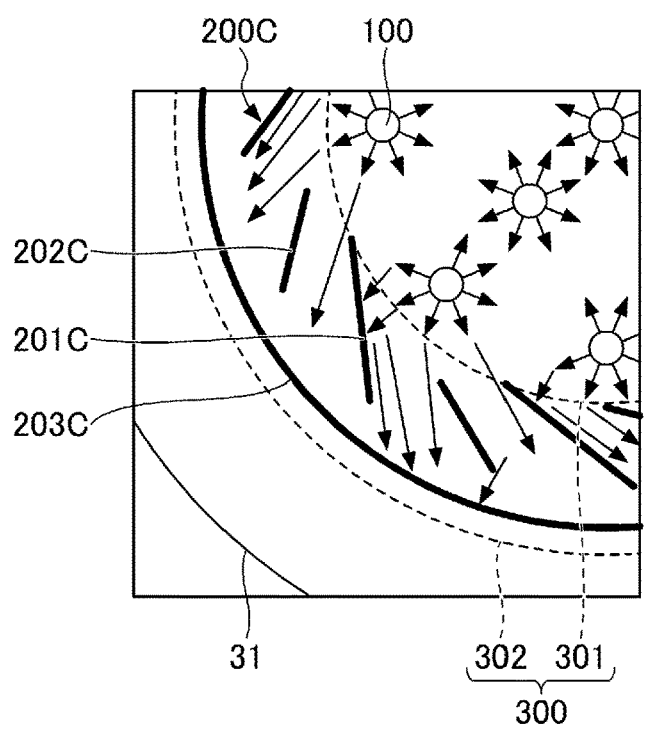
FIG. 9 illustrates an example of a plan view depicting a structure of a showerhead of a substrate processing apparatus according to a fourth embodiment.

FIG. 9 is an example of a plan view depicting a structure of a showerhead 3C of a substrate processing apparatus according to a fourth embodiment. The structure of the showerhead 3C of the substrate processing apparatus according to the fourth embodiment includes a flow adjusting plate 200C. The flow adjusting plate 200C includes a flow adjusting plate 201C, a flow adjusting plate 202C, and a flow adjusting plate 203C. The flow adjusting plate 201C is provided to pass through a portion where the discharge directions of the gas supply parts 100 arranged side by side intersect. The flow adjusting plate 202C is provided between flow adjusting plates 201C adjacent to each other. The flow adjusting plate 203C is formed in a cylindrical shape that is concentric with the showerhead 3 and is disposed on the outer circumferential side from the flow adjusting plates 201C and 202C. By providing the cylindrical flow adjusting plate 203C on the outer circumference, the gas flow at the outer periphery can be adjusted, thereby improving the in-plane uniformity of the tungsten film deposited on the substrate W.

Figure 10:
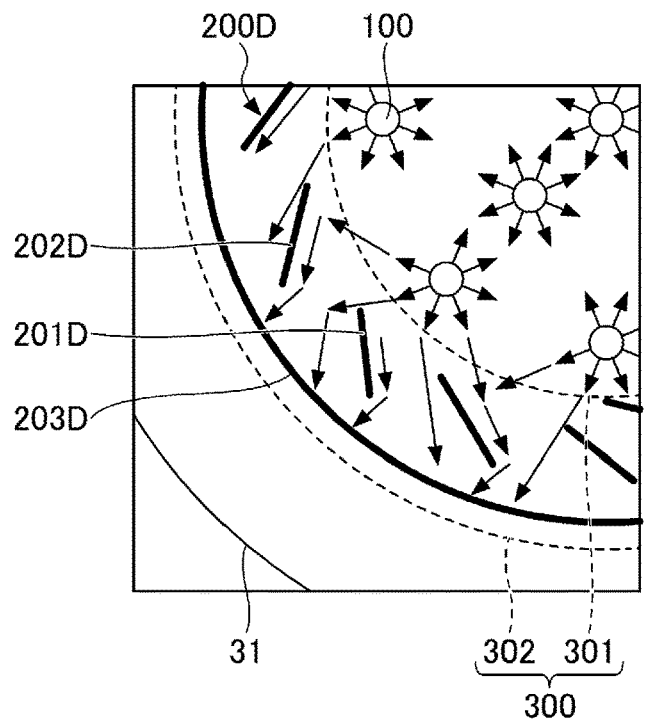
FIG. 10 illustrates an example of a plan view depicting a structure of a showerhead of a substrate processing apparatus according to a fifth embodiment.

FIG. 10 is an example of a plan view depicting a structure of a showerhead 3D of a substrate processing apparatus according to a fifth embodiment. The structure of the showerhead 3D of the substrate processing apparatus according to the fifth embodiment includes a flow adjusting plate 200D. The flow adjusting plate 200D includes a flow adjusting plate 201D, a flow adjusting plate 202D, and a flow adjusting plate 203D. The flow adjusting plate 201D is formed shorter on the inner circumferential side than the flow adjusting plate 201C illustrated in FIG. 9. The flow adjusting plate 201D is provided so that the longitudinal direction of the flow adjusting plate 201D includes a portion where the discharge directions of the gas supply parts 100 arranged side by side intersect. The flow adjusting plate 202D is provided between the flow adjusting plates 201D adjacent to each other. The flow adjusting plate 203D is formed in a cylindrical shape that is concentric with the showerhead 3 and is disposed on the outer circumferential side from the flow adjusting plates 201D and 202D. By forming the flow adjusting plates 201D and 202D to be short on the inner circumferential side, the gas flow can be adjusted, thereby improving the in-plane uniformity of the tungsten film deposited on the substrate W.

Figure 11:
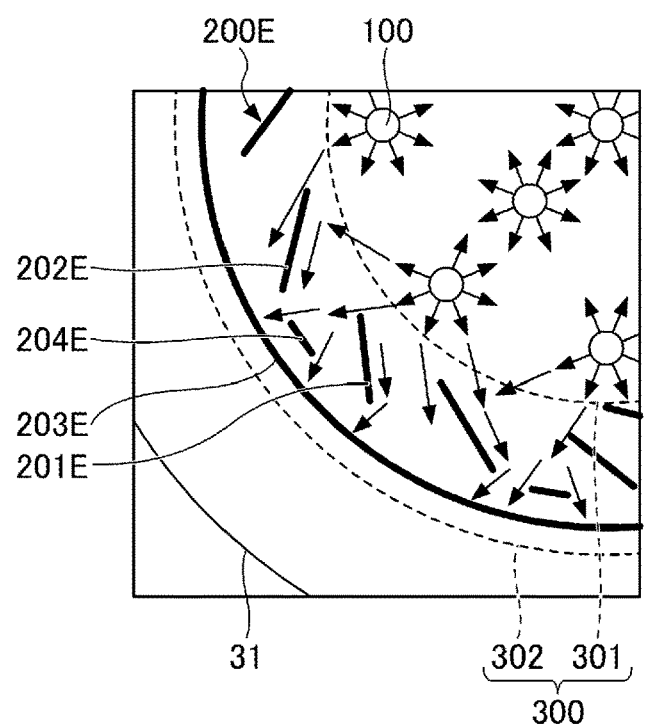
FIG. 11 illustrates an example of a plan view depicting a structure of a showerhead of a substrate processing apparatus according to a sixth embodiment.

FIG. 11 is an example of a plan view depicting a structure of a showerhead 3E of a substrate processing apparatus according to a sixth embodiment. The structure of the showerhead 3E of the substrate processing apparatus according to the sixth embodiment includes a flow adjusting plate 200E. The flow adjusting plate 200E includes a flow adjusting plate 201E, a flow adjusting plate 202E, a flow adjusting plate 203E, and a flow adjusting plate 204E. The flow adjusting plate 201E is provided so that the longitudinal direction of the flow adjusting plate 201E includes a portion where the discharge directions of the gas supply parts 100 arranged side by side intersect. The flow adjusting plate 202E is provided between the flow adjusting plates 201E adjacent to each other. The flow adjusting plate 203E is formed in a cylindrical shape that is concentric with the showerhead 3 and is disposed on the outer circumferential side from the flow adjusting plates 201E and 202E. The flow adjusting plate 204E is disposed between the flow adjusting plate 201E and the flow adjusting plate 202E and/or between the flow adjusting plates 201E and 202E and the flow adjusting plate 203E. This allows the gas flow to be adjusted, thereby improving the in-plane uniformity of the tungsten film deposited on the substrate W.

Figure 12:
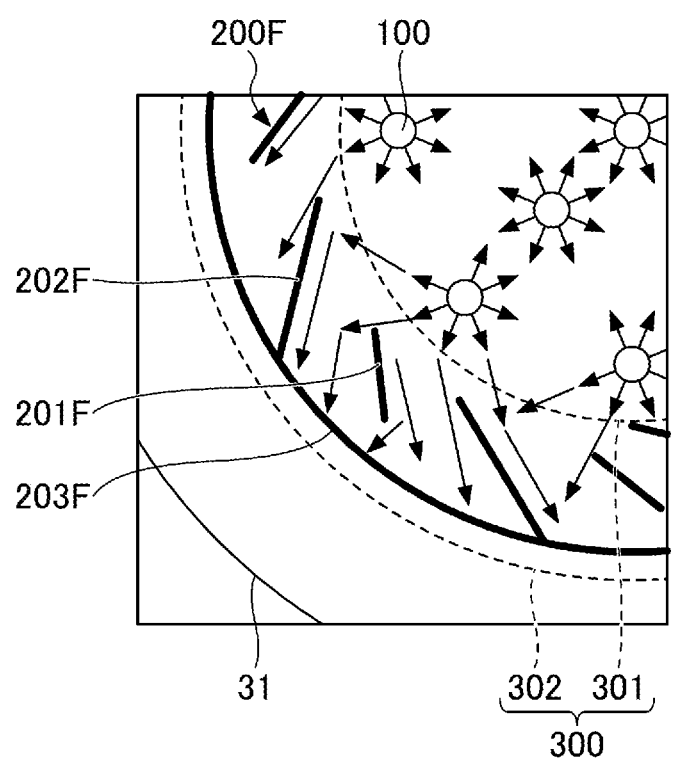
FIG. 12 illustrates an example of a plan view depicting a structure of a showerhead of a substrate processing apparatus according to a seventh embodiment.

FIG. 12 is an example of a plan view depicting a structure of a showerhead 3F of a substrate processing apparatus according to a seventh embodiment. The structure of the showerhead 3F of the substrate processing apparatus according to the seventh embodiment includes a flow adjusting plate 200F. The flow adjusting plate 200F includes a flow adjusting plate 201F, a flow adjusting plate 202F, and a flow adjusting plate 203F. The flow adjusting plate 201F is provided so that the longitudinal direction of the flow adjusting plate 201F includes a portion where the discharge directions of the gas supply parts 100 arranged side by side intersect. The flow adjusting plate 202F is provided between flow adjusting plates 201F adjacent to each other. The flow adjusting plate 203F is formed in a cylindrical shape that is concentric with the showerhead 3 and is disposed on the outer circumferential side from the flow adjusting plates 201F and 202F. The flow adjusting plate 202F extends to the flow adjusting plate 203F on the outer circumferential side. This allows the gas flow to be adjusted, thereby improving the in-plane uniformity of the tungsten film deposited on the substrate W. Here, a case, in which the flow adjusting plate 202F extends to the flow adjusting plate 203F on the outer circumferential side, is described as an example. However, the embodiment is not limited thereto, and the flow adjusting plate 201F may extend to the flow adjusting plate 203F on the outer circumferential side.

As described above, by providing the flow adjusting plate 200 (200A to 200F) in the gas diffusion space 34, the gas flow in the gas diffusion space 34 can be adjusted, thereby controlling the in-plane uniformity of the tungsten film deposited on the substrate W.

According to at least one embodiment of the present disclosure, a showerhead and a substrate processing apparatus that improve the in-plane distribution of the film thickness can be provided.

The substrate processing apparatus according to the embodiments disclosed herein are to be considered as examples in all respects and not restrictive. Embodiments can be modified and improved in various forms without departing from the scope of the claims and the subject matter thereof. The matters described in the above embodiments may be used in another embodiment to the extent not inconsistent, or may be combined to the extent not inconsistent.

What is claimed is:

1. A showerhead comprising:
a shower plate;
a base member in which a gas flow passage is provided, the base member fixing the shower plate;
a plurality of gas supply members disposed in a gas diffusion space and connected to the gas flow passage, the gas diffusion space being formed between the shower plate and the base member; and
a plurality of linear flow adjusting plates disposed in the gas diffusion space, the plurality of linear flow adjusting plates being disposed on an outer periphery on an outer side from the plurality of gas supply members such that gas flows between two adjacent flow adjusting plates among the plurality of linear flow adjusting plates,
wherein each of the plurality of linear flow adjusting plates is tilted at a predetermined angle with respect to a line extending from a center of the showerhead in a radial direction.

2. The showerhead as claimed in claim 1,
wherein the plurality of gas supply members includes a first gas supply member and a second gas supply member, the second gas supply member being disposed adjacent to the first gas supply member, and
wherein the plurality of linear flow adjusting plates includes a first flow adjusting plate including an end where a discharge direction of a first discharge outlet of the first gas supply member intersects a discharge direction of a first discharge outlet of the second gas supply member, the first discharge outlet of the first gas supply member is located in a direction of rotation from a centerline between centers of the first gas supply member and the second gas supply member toward an outer circumferential side of the showerhead, and the first discharge outlet of the second gas supply member is located in a direction of rotation from the centerline between the centers of the first gas supply member and the second gas supply member toward the outer circumferential side of the showerhead.

3. The showerhead as claimed in claim 2, wherein the plurality of linear flow adjusting plates further includes a plurality of second flow adjusting plates interleaving with said plurality of first flow adjusting plates.

4. The showerhead as claimed in claim 3, wherein the plurality of second flow adjusting plates are formed to be shorter than the plurality of first flow adjusting plates.

5. A substrate processing apparatus comprising the showerhead as claimed in claim 1.

6. The showerhead as claimed in claim 1, wherein the plurality of linear flow adjusting plates extend to reach an inner wall of the gas diffusion space.

7. The showerhead as claimed in claim 1, wherein the gas diffusion space includes an annular space region where the plurality of linear flow adjusting plates are not disposed.

8. The showerhead as claimed in claim 1, wherein a third flow adjusting plate is formed in a cylindrical shape that is concentric with the showerhead and is disposed on an outer circumferential side from the plurality of linear flow adjusting plates.

* * * * *